United States Patent
Hanson et al.

(10) Patent No.: US 6,215,349 B1
(45) Date of Patent: Apr. 10, 2001

(54) CAPACITIVE COUPLED DRIVER CIRCUIT

(75) Inventors: David Russell Hanson, Brewster; Gerhard Mueller, Wappingers Falls, both of NY (US)

(73) Assignees: International Business Machines Corp., Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/265,253

(22) Filed: Mar. 9, 1999

Related U.S. Application Data

(63) Continuation-in-part of application No. 09/225,664, filed on Jan. 5, 1999, now Pat. No. 6,127,878.

(51) Int. Cl.[7] .................................................. H03K 17/16
(52) U.S. Cl. .......................................................... 327/390
(58) Field of Search ................................. 327/108, 109, 327/110, 111, 112, 374, 376, 390, 427

(56) References Cited

U.S. PATENT DOCUMENTS

| | | | |
|---|---|---|---|
| 4,868,427 | 9/1989 | Fitzpatrick et al. | 307/475 |
| 4,959,561 | 9/1990 | McDermott et al. | 307/443 |
| 4,984,202 | 1/1991 | Kawahara et al. | 365/177 |
| 5,426,334 | * 6/1995 | Skovmand | 327/427 |
| 5,446,406 | 8/1995 | Gantioler et al. | 327/427 |
| 5,514,994 | * 5/1996 | Sawada | 327/390 |
| 5,532,640 | * 7/1996 | Okunaga | 327/537 |
| 5,563,545 | * 10/1996 | Scheinberg | 327/389 |
| 5,672,992 | * 9/1997 | Nadd | 327/390 |
| 5,703,825 | 12/1997 | Akiba et al. | 365/229 |
| 5,808,956 | 9/1998 | Maruyama | 365/230.06 |
| 5,905,400 | * 5/1999 | Runkel | 327/390 |
| 5,929,686 | * 7/1999 | Itou | 327/321 |

FOREIGN PATENT DOCUMENTS

| | | |
|---|---|---|
| 0 602 708 | 3/1993 | (EP). |
| 0 821 362 A1 | 7/1996 | (EP). |

* cited by examiner

*Primary Examiner*—Jeffrey Zweizig
(74) *Attorney, Agent, or Firm*—Stanton Braden

(57) ABSTRACT

A high performance driver circuit is described. The driver produces increased current flow at its output to decrease charging time. Increased current flow is achieved by providing an overdrive circuit that provides a voltage offset to increase the magnitude of the overdrive voltage.

36 Claims, 5 Drawing Sheets

CAPACITIVE COUPLED DRIVER CIRCUIT

This is a continuation-in-part of U.S. patent application U.S. Ser. No. 09/225,664, now filed Jan. 5, 1999, now U.S. Pat. No. 6,127,878 titled "Improved Driver Circuit."

FIELD OF THE INVENTION

This disclosure relates to semiconductor devices. More particularly, the disclosure relates to a driver circuit that enables high frequency operation.

BACKGROUND OF THE INVENTION

Due to higher frequencies at which semiconductor integrated circuits (ICs) operate, IC designers are confronted with smaller or tighter operating windows. For example, in memory ICs such as dynamic random access memories (DRAMs), it is becoming more difficult to perform certain operations such as reads, writes, or precharges within a chip's cycle time. An aspect that limits the speed of operations in memory ICs is the charging of bus lines. For example, there are buses that need to be charged to an appropriate level within a clock cycle. Clocking the operation of ICs is a well-established concept. Higher operating frequencies make it increasingly difficult for a driver circuit to charge buses within the given clock cycle.

The inability of the charge circuitry to charge the buses within the given time may require a modification in the chip's operational specification. For example, a DRAM may require a wait cycle after a write operation before a read operation can be performed. However, such a solution is undesirable as it impairs performance.

A conventional technique for improving the performance of the driver is to increase the voltage to which the driver charges the load. This produces an increase in the differential or voltage swing between the logic high and logic low voltage levels. The larger voltage swing between the high and low levels requires a greater amount of time to charge and discharge, for example, the buses, causing a degradation in performance. Additionally, increasing the voltage increases the power consumption, which is undesirable, particularly with portable systems such as laptop computers.

As evidenced by the above discussion, it is desirable to provide an improved driver circuit with an increase in charge rate that allows for faster operation of ICs.

SUMMARY OF THE INVENTION

The invention relates to a driver circuit that enables high frequency operation. High frequency operation is achieved by causing the driver circuit to operate in an increased overdrive mode to increase the current flow at the output of the driver.

In accordance with the invention, an overdrive circuit is provided. The overdrive circuit increases the magnitude of the active input signal to the driver circuit, which increases the overdrive voltage applied to a driver transistor of the driver circuit. Increasing the overdrive boosts the performance of the driver transistor.

In one embodiment, the driver circuit comprises a pull-up portion to which the overdrive circuit provides an input signal. The active input signal from the overdrive circuit renders the pull-up driver transistor conductive. The overdrive circuit comprises a capacitive coupling to the input signal, creating a dynamic offset. In one embodiment, the capacitive coupling produces a dynamic offset having a peak magnitude of about 0.2–1.5 V, preferably about 0.2–1.0 V. The offset increases the magnitude of the gate overdrive voltage of the pull-up transistor, boosting the performance of the pull-up driver portion. The driver circuit can also comprise a pull-down portion. A dynamic offset via a capacitive coupling can also be applied to the input signal of the pull-down driver transistor in order to boost its performance.

In one embodiment, the pull-up portion of the driver comprises a p-FET. The overdrive circuit switches on or renders the driver transistor conductive by providing an active input signal which is negative with respect to ground. The overdrive circuitry provides a negative dynamic offset having a peak magnitude of about −0.2 to −1.5 V and preferably about −0.2 to −1.0 V to the active low signal to increase the magnitude of the gate overdrive voltage. In one embodiment, the negative dynamic offset causes the active low signal to be negative with a peak magnitude of about −0.2 to −1.5 V, preferably −0.2 to −1.0 V.

In another embodiment, the overdrive circuit provides, by using capacitive coupling techniques, an input to a pull-down portion of the driver circuit comprising an n-FET. The capacitive coupling provides a dynamic offset which increases the magnitude of the gate overdrive voltage applied to the pull-down transistor. In one embodiment, the capacitive coupling produces a dynamic offset having a peak magnitude of about 0.2–1.5 V, preferably about 0.2–1.0 V. The dynamic offset increases the active high input signal to the pull-down transistor by about 0.2–0.5 V and preferably about 0.1–1.0 V in order to increase the gate overdrive voltage, boosting the driver performance.

DESCRIPTION OF THE INVENTION

The invention relates to semiconductor devices and, more particularly, to a driver circuit for use with semiconductor devices. The semiconductor devices may be, for example, memory circuits such as random access memories (RAMs), dynamic RAMs (DRAMs), synchronous DRAMs (SDRAMs), ferroelectric RAMs (FRAMs), protocol oriented RAMs like RDRAMs (direct Rambus) or SLDRAMs (Synclink DRAMs) or static RAMs (SRAMs). The semiconductor devices may also be logic devices such as programmable logic arrays (PLAs), application specific integrated circuits (ASICs), merged DRAM-logic ICs (embedded DRAMs), or any other circuit devices. The semiconductor devices are used in, for example, consumer electronic products such as computer systems, office equipment including copiers and printers, cellular phones, personal digital assistants (PDAs), and other electronic products.

In accordance with the invention, the driver circuit operates in an increased overdrive mode in order to increase the current flow rate at its output. In one embodiment of the invention, the driver circuit provides faster charging of buses. This, for example, can enable a write cycle followed immediately by a read cycle to be performed in a high frequency memory circuit. Other applications of the invention includes, for example, increasing the charge rate of address lines, command lines, control lines, read/write control lines (e.g., internal RAS, internal CAS, or internal read command), read/write data lines, or other types of buses.

Figure 1:
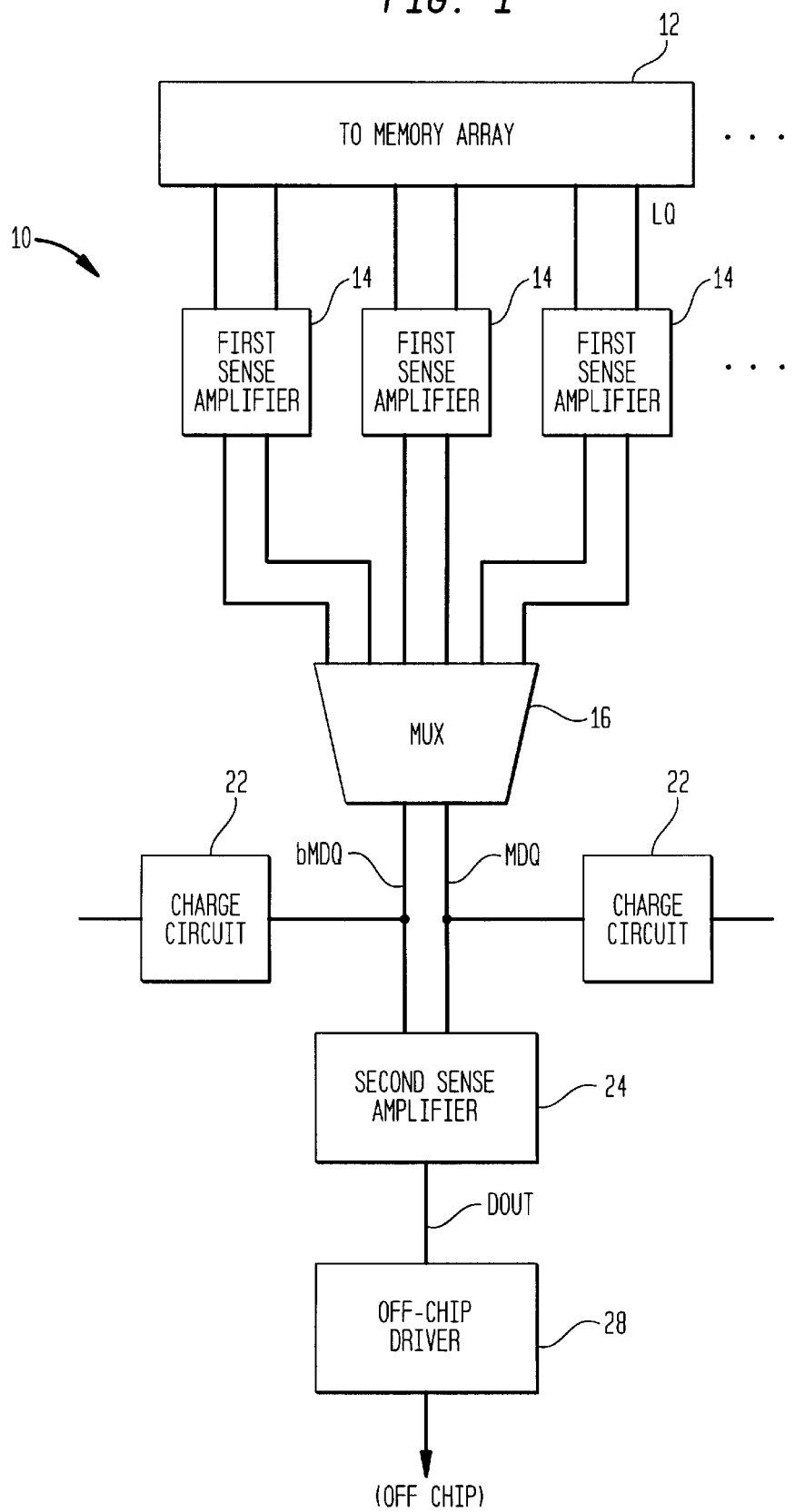
FIG. 1 shows a block diagram of a memory IC in accordance with one embodiment of the invention.

Referring to FIG. 1, a block diagram of an illustrative memory circuit 10 is shown. Other types of memory architectures are also useful. As shown, the memory chip comprises a plurality of first sense amplifiers 14 multiplexed by a MUX 16 to a second sense amplifier 24 over global data buses MDQ and bMDQ. First sense amplifiers 14 detect a charge from a memory cell in a memory array 12, and second sense amplifier 24 translates this charge to a higher level (DOUT) to be driven out of the chip by an off-chip driver 28. Charge circuits 22 are connected to global data buses MDQ and bMDQ.

In one embodiment, the charge circuit includes a driver circuit which is capable of charging the global data buses at a fast rate. The charge circuit is particularly useful in high frequency applications as it enables precharging of the data buses to the desired level within one clock cycle.

Figure 2:
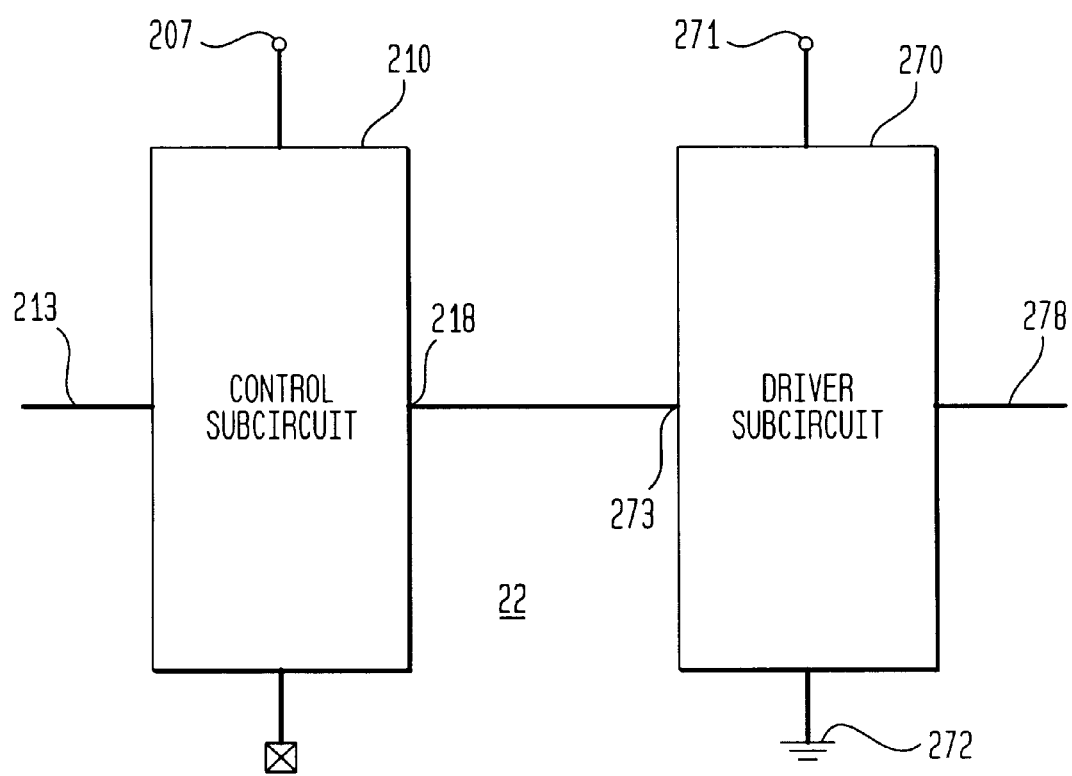
FIG. 2 shows a block diagram of a driver circuit in accordance with the invention.

FIG. 2 shows a block diagram of a charge circuit 22 in accordance with one embodiment of the invention. Illustratively, the charge circuit 22 comprises a driver subcircuit 270, an overdrive subcircuit 240, and a control subcircuit 210.

The driver subcircuit comprises a driver transistor, representing the pull-up portion, for charging of a load coupled to an output 278 to the level of an upper power rail 271. In one embodiment, the driver transistor comprises a p-type field effect transistor (p-FET). The driver transistor includes first, second, and gate terminals. The first terminal is coupled to the upper power rail 271, the second terminal is coupled to the driver output 278, and the gate is coupled to a driver input 273. The upper power rail comprises a voltage level at which the load is charged. In one embodiment, the upper power rail comprises $V_{blh}$.

Activating the pull-up portion of the driver subcircuit causes the driver transistor to be switched on or conductive, coupling the upper power rail to the output. This causes current to flow from the upper rail to the output, thereby charging the load to the level of the upper power rail. Deactivating the pull-up portion of the driver circuit switches the driver transistor off or renders it non-conductive, decoupling the driver output from the upper power rail.

To activate the pull-up portion, an active driver signal is provided at the driver input 273. Providing an inactive driver signal at the driver input deactivates the pull-up portion. In one embodiment, the inactive driver signal is a logic high signal; the active driver signal is a logic low signal.

A pull-down portion can be included in the driver subcircuit. The pull-down portion comprises a driver transistor. In one embodiment, the pull-down driver transistor comprises an n-type field effect transistor (n-FET). Activating the pull-down portion of the driver subcircuit causes the pull-down driver transistor to be switched on or conductive, coupling a lower power source or rail 272 to the output. This causes the load to be discharged to the level of the lower power rail. Deactivating the pull-down portion of the driver circuit switches the pull-down driver transistor off or renders it non-conductive, decoupling the driver output from the lower power rail.

To activate the pull-down portion, an active pull-down driver signal is provided at the gate of the driver transistor. Providing an inactive pull-down driver signal at the gate of the pull-down driver transistor deactivates the pull-down portion. In one embodiment, the inactive pull-down driver signal is a logic low signal; the active pull-down driver signal is a logic high signal.

The overdrive subcircuit 240 comprises an overdrive output 248 coupled to the driver input 273. Operation of the overdrive subcircuit is controlled by one or more input signals at the overdrive inputs. As shown, the overdrive subcircuit comprises inputs 243 and 244. In one embodiment, an overdrive output signal at output 248 controls the operation of the pull-up portion of the driver subcircuit. An active or inactive overdrive output signal serves as the driver input signal to activate or inactivate the pull-up portion, respectively.

Input 243 is coupled to an output 218 of the control subcircuit 210. The control subcircuit generates a control output signal at output 218 in response to one or more input signals at its inputs 213. The control subcircuit generates an active or inactive control output signal to indicate that the driver subcircuit is to be activated or deactivated, respectively. The overdrive output signal, which is used to control the operation of the driver subcircuit, is derived from the output control signal.

The overdrive subcircuit provides an offset to the active control output signal at input 243, generating an active overdrive output signal at the output 248 which results in an increase in the magnitude of the overdrive voltage. The overdrive voltage is the difference between a gate source voltage and the threshold voltage of the driver transistor. Increasing the overdrive voltage causes the driver transistor to operate in an increased overdrive mode, boosting its performance.

In one embodiment, the overdrive subcircuit comprises a capacitive coupling to the input of the driver subcircuit, producing a dynamic offset. The use of a capacitive coupling advantageously provides a dynamic local power source to increase the magnitude of the overdrive voltage, eliminating the need to provide an external power source.

The amount of performance boost depends on the magnitude of the dynamic offset, which determines the magnitude that the overdrive voltage is increased. In one embodiment, the dynamic offset comprises a peak magnitude of about 0.2–1.5 V and preferably by about 0.2–1.0 V. Providing other offset values that increase the magnitude of the overdrive voltage are also useful, depending on the performance boost needed or design parameters.

In the case of a p-FET pull-up driver transistor which is activated by a logic 0 signal, the overdrive subcircuit provides a negative dynamic offset having a peak magnitude of about −0.2 to −1.5 V and preferably by about −0.2 to −1.0 V. This causes the active low overdrive signal to have a magnitude of about −0.2 to −1.5 V and preferably about −0.2 to −1.0 V. For an n-FET pull-down driver transistor which is activated by a logic 1 signal, the overdrive subcircuit provides a dynamic offset having a peak magnitude of about 0.2 to 1.5 V and preferably about 0.2 to 1.0 V. This increases the magnitude of the active control output signal by about 0.2 to 1.5 V and preferably by about 0.2 to 1.0 V.

In accordance with the invention, the performance boost in the driver transistor is achieved by increasing the overdrive voltage. Such a technique boosts performance without needing to increase the voltage differential between the high and low logic levels of the load. This is contrary to conventional techniques which improve driver performance by increasing the voltage differential between the high and low logic levels. The performance boost provides, for example, faster charging of the global data buses of a memory IC.

Figure 3:
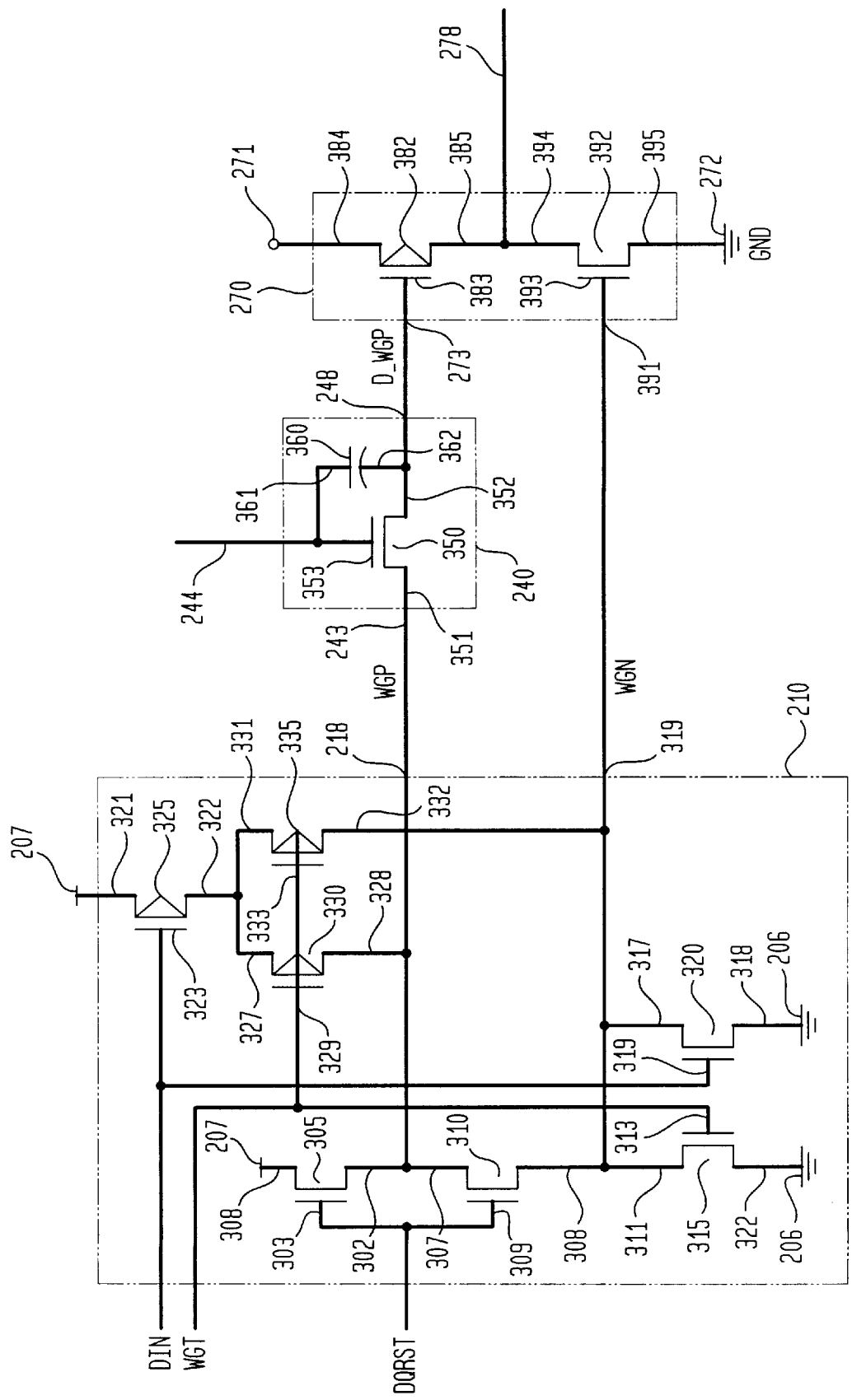
FIG. 3 shows a driver circuit in accordance with one embodiment of the present invention.

Referring to FIG. 3, one embodiment of the invention is shown. The driver subcircuit 270 comprises a first transistor 382. The first transistor is a driver transistor, representing the pull-up portion. As shown, the driver transistor is a p-FET. The transistor includes first, second, and gate terminals 384, 385, and 383. The first terminal is coupled to an upper power rail 271 ($V_{blh}$). $V_{blh}$, which for example is equal to the upper voltage level of the bitlines, can be less than $V_{DD}$. A typical value for $V_{blh}$ can be about ⅔ $V_{DD}$. Other values, such as ¾ $V_{DD}$ or $V_{DD}$, are also useful. The second electrode is coupled to the driver output 278. The gate is coupled to the driver input 273.

A second transistor 392 can be provided, representing the pull-down portion. The second transistor, which illustratively is an n-FET, comprises first, second, and gate terminals 394, 395, and 393. The first terminal is coupled to the output and the second terminal of the first transistor. The second terminal is coupled to a lower power rail 272, which is equal to ground.

Transistors 382 and 392 can operate in a push-pull configuration (i.e., one transistor is on while the other is off). Also, both transistors 382 and 392 can be off to tri-state the output. To activate the pull-up portion of the driver subcircuit, an active signal (logic 0) is provided at input 273 and an inactive signal (logic 0) is provided at input 391. This renders transistor 382 conductive and transistor 392 non-conductive, thereby causing the output to be equal to about $V_{blh}$. To activate the pull-down portion of driver subcircuit, an inactive signal (logic 1) is provided at input 273 and an active signal (logic 1) is provided at input 391. This renders transistor 392 conductive and transistor 382 non-conductive, thereby causing the output to be at ground. Deactivating the pull-up portion of the driver circuit decouples the upper power rail from the output. Deactivating the pull-down portion of the driver circuit decouples the output from the lower power rail. To tri-state the driver subcircuit, inactive signals are provided at inputs 273 and 391 to deactivate both the pull-up and pull-down portions.

In one embodiment, the overdrive subcircuit 240 comprises a transistor 350 and a capacitive element 360. As shown, the transistor comprises an n-FET having first, second, and gate terminals 351, 352, and 353. The first and second terminals are coupled to input 243 and output 248 of the overdrive subcircuit, and the gate is coupled to input 244 of the overdrive subcircuit. The capacitive element 360 is coupled to the output 248, providing a capacitive coupling to the input of the driver subcircuit in order to improve the performance of the pull-up driver transistor. In one embodiment, the capacitive element comprises a capacitor having a first electrode 361 coupled to input 244 and a second electrode 362 coupled to output 248.

DRAM ICs usually comprise capacitive elements that are used as storage elements for memory cells. The capacitive elements include, for example, trench and stack capacitors, which are well-known to those skilled in the art. Typically, trench capacitors are realized in the substrate while stack capacitors are realized above the substrate.

The use of a stack or trench capacitor to serve as the capacitive element 360 can be advantageous as such types of capacitors can provide the desired capacitance value while requiring small surface area. This is desirable as this reduces the area penalty associated with implementing the invention.

Furthermore, implementing the capacitive element with the same type of capacitors used in the memory cells of a DRAM chip is particularly useful as this saves processing steps.

The overdrive voltage of the pull-up portion of the driver is defined as the difference between the gate-source voltage ($V_{GS}$) and threshold voltage ($V_T$) of transistor 382. $V_{GS}$ is equal to the voltage potential at the gate 383 with respect to the source electrode 384. In accordance with one embodiment of the invention, the overdrive subcircuit provides a dynamic offset which increases the magnitude of $V_{GS}$ of transistor 382. Increasing the magnitude of $V_{GS}$ produces an increase in the overdrive voltage of the driver transistor, thereby increasing the rate of current flow at the output 278.

In one embodiment, the overdrive subcircuit is activated by a logic 0 at input 244 and deactivated by a logic 1 at input 244. The overdrive subcircuit is activated when an active overdrive input signal (logic 0 which indicates that the pull-up portion of the driver is to be activated) passes from input 243 to node 273. Activating the overdrive subcircuit produces a negative voltage at node 273 which is passed through to the gate 383 of the pull-up driver transistor. The negative voltage produces an increase in the gate overdrive as compared to conventional techniques which provide an active low signal equal to ground.

The operation to increase the overdrive of the pull-up driver transistor will be described in detail. A logic 0 or ground (active WGP) is provided at input 243 and a logic 1 is provided at input 244. This renders transistor 350 to be conductive, causing node 273 to also be at ground. A logic 0 is then provided at input 244 to switch transistor 350 off, isolating node 273 from any supply voltage. Due to the coupling capacitor 360 and the overlap capacitance of transistor 350, node 273 is pulled down below ground when node 244 switches from a logic 1 to a logic 0. The negative voltage level at 273 (O_WGP) provides a negative offset, producing an active overdrive output signal at output 273 that is negative with respect to ground.

The magnitude of the created negative dynamic offset voltage primarily depends on the threshold voltage of transistor 350 and the ratio (total capacitance of node 273)/(capacitance between the nodes 244 and 273). Increasing the threshold voltage and/or decreasing the capacitance ratio causes the offset magnitude to increase. Increasing the capacitance of capacitor 360 decreases the capacitance ratio. The maximum magnitude of the offset is reached when the ratio is one. With the gate threshold voltage ($V_T$) of the driver transistor typically at about 0.7 V, a capacitance 50 ff–250 ff can produce an offset having a magnitude of about 0.2–1.5 V, preferably about 0.2–1.0 V. Other capacitances are also useful, depending on design requirements.

The charge stored in the capacitor 360 discharges over time, causing the offset to be dynamic. The rate at which the offset diminishes depends on the leakage through transistor 350, leakage through the capacitor 360, and leakage from the node 273.

The pull-up portion of the driver is activated to charge the load to the desired level. The amount of time that the pull-up portion needs to be activated to pull-up the load 278 can be calculated by:

$$dt = C \, dV/I(t),$$

where
    dt=the derivative of time t,
    dV=the derivative of voltage V,

C=the load capacitance, and

I=the current of the pull up transistor.

In one embodiment, the pull-up portion is activated sufficiently long enough to charge the global data buses to about $V_{blh}$. Typically, the pull-up portion is activated for about 1–5 ns.

An overdrive subcircuit comprising a capacitive coupling that provides a positive offset is also useful, such as in the case where the active overdrive output signal is a logic 1 to activate an n-FET pull-down driver transistor.

Figure 4:
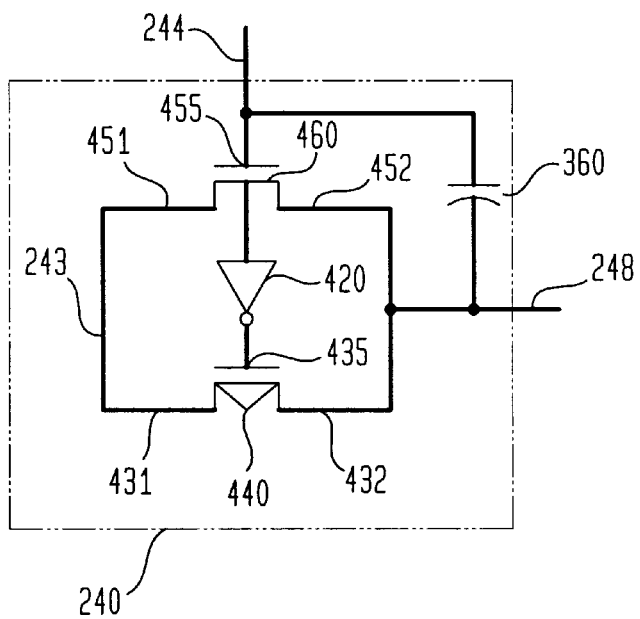
FIG. 4 shows an alternative embodiment of the overdrive subcircuit.

FIG. 4 shows an alternative embodiment of an overdrive subcircuit 240. The overdrive subcircuit comprises transistors 440 and 460 coupled in parallel and a capacitive element 360. As shown, the transistor 460 is an n-FET having first and second terminals 451 and 452; transistor 440 is a p-FET having first and second terminals 431 and 432. The first terminals are coupled together to an input 243 and the second terminals are coupled together to an output 248. The capacitive element is coupled to an input 244 and the output 248. A gate 455 is coupled to the input 244; a gate 435 is coupled to input 244 via an inverter 420.

Referring back to FIG. 3, the control subcircuit 210 receives inputs and generates one or more output signals. The output signals are used to control or to derive signals to control the operation of the driver subcircuit. In one embodiment, the control subcircuit receives inputs related to the charging of the global data buses of a memory IC.

Illustratively, the control subcircuit receives input signals to control the charging and discharging of the global data bus MDQ. In one embodiment, the control circuit receives input signals DIN, bWGT, and DQRST. The b prefix indicates that the signal is an active low signal. To control the charging and discharging of the complement global data bus bMDQ, input signals bDIN, bWGT, and DQRST can be used. The DIN signal represents the data in signal corresponding to the data that is to be written to memory. The bWGT and DQRST signals are used to determine whether a write, read, or precharge operation is to be performed. The operations corresponding to the bWGT and DQRST signals are described in Truth Table 1.

Truth TABLE 1

| DQRST | Bwgt | Operation |
|---|---|---|
| 0 | 0 | Illegal |
| 0 | 1 | Read |
| 1 | 0 | Write |
| 1 | 1 | Precharge |

The value of the DIN signal during a write operation determines whether it is a write "1" or write "0" operation. For other operations, the value of DIN has no effect (don't care). Writing a 1 or a 0 to memory depends on DIN signal. In one embodiment, a write "1" is performed if DIN equals a logic 1 during a write operation and a write "0" is performed if DIN is equal to a logic 0 during a write operation. The global data bus MDQ is precharged during a write "1" and discharged during a write "0" operation. The complement global data bus bMDQ, on the other hand, is precharged during a write "0" and discharged during a write "1" operation. Both MDQ and bMDQ are precharged to $V_{blh}$ during a precharge operation. During a read or an illegal operation, the buses are disconnected from the driver subcircuit. The outputs WGN and WGP of the control subcircuit corresponding to the different operations on the global data bus MDQ are described in Table 2.

TABLE 2

| | WGN | WGP |
|---|---|---|
| Read | 0 | 1 |
| Precharge | 0 | 0 |
| Write 0 | 1 | 1 |
| Write 1 | 0 | 0 |

Depending on the operation, an active WGP signal (logic 0) charges the MDQ. In accordance with one embodiment of the invention, the active WGP signal is negative with respect to ground in order to increase the overdrive of the overdrive subcircuit. In one embodiment, the WGP active signal is equal to about the negative wordline low voltage or $V_{BB}$.

In one embodiment, the control subcircuit for controlling MDQ employs non-sequential logic to generate the output signals WGP and WGN in response to the input signals DIN, bWGT, and DQRST. Implementing the control subcircuit with non-sequential logic improves performance by saving one or more delay stages. The use of input signals bDIN, bWGT, and DQRST to generate output signals to control bMDQ is also useful.

As shown, transistors 305, 310, and 315 are configured in series. Transistor 305 is a p-FET, and transistors 310 and 315 are n-FETs. An upper rail 207, such as $V_{DD}$, is coupled to first terminal 301 of transistor 305. In one embodiment, $V_{DD}$ is about 2 V. Other voltage levels are also useful.

A second terminal 312 of transistor 315 is coupled to a lower power rail 206 comprising ground. Alternatively, providing a lower power rail which is negative with respect to ground is also useful. A negative lower power rail is described in co-pending U.S. patent application U.S. Ser. No. 09/225,664, titled "Improved Driver Circuit," which is herein incorporated by reference for all purposes.

Output 218, which provides the WGP signal, is coupled to a first terminal 307 of transistor 310 and a second terminal 302 of transistor 305. Output 319, which provides the WGN signal, is coupled to a first terminal 311 of transistor 315 and a second terminal 308 of transistor 310. Also coupled to output 319 is a first terminal 317 of a transistor 320. Transistor 320, for example, is an n-FET. A second terminal 318 is coupled to the lower power rail 206. The DIN signal is provided at a gate 319 for controlling transistor 320. Whenever an n-FET is connected to the lower power rail, the body is connected to the lower power rail.

The control subcircuit also includes transistors 325, 330, and 335. The transistors 325, 330, and 335 are, for example, p-FETs. As shown, transistor 325 is coupled in series with transistors 330 and 335. Transistors 330 and 335 are coupled in parallel. A first terminal 321 of transistor 325 is coupled to an upper power rail 207, and the second terminal 322 is coupled to first terminals 327 and 331 of transistors 330 and 335. A second terminal 328 of transistor 330 is coupled to output 218, and a second terminal 332 of transistor 335 is coupled to output 319. The DIN signal is provided at a gate 323 to control transistor 325. Transistors 330 and 335 are controlled by the bWGT signal via gates 329 and 333.

Such a control circuit produces the results as described in Tables 1 and 2. Alternative control circuits, such as those described in co-pending U.S. patent application U.S. Ser. No. 09/225,664, which is already incorporated by reference for all purposes, are also useful. A control circuit that generates outputs in response to inputs in accordance with other truth tables is also useful. The logic of the active signal or signals can be switched by, for example, using p-FETs instead or n-FETS and vice-versa.

As shown, the driver circuit is used to charge the MDQ global data bus. The charge circuit can also be used to charge the bMDQ data bus. Signals that control charging the bMDQ data bus include, for example, DQRST, bDIN, and WGT.

Figure 5:
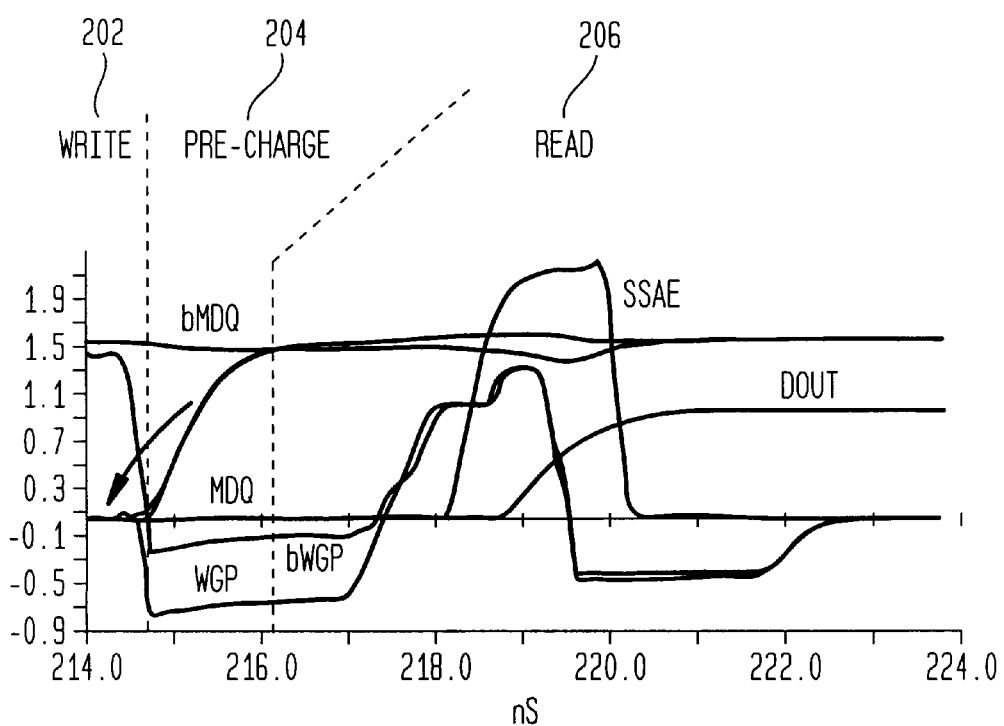
FIG. 5 shows a timing diagram for a driver circuit in accordance with one embodiment of the invention.

A simulation of a driver circuit in accordance with one embodiment of the invention was conducted using SPICE. A load of 2 pF was used in the simulation. The simulation replicated a read "1" after a write "0" on the same global data bus. FIG. 5 shows the resulting timing diagram of the driver circuit from the simulation. As shown, WGP and bWGP are shown being driven below ground in a precharge phase 204 after the write phase 202. The MDQ line quickly rises to the up-level in a 2 ns time window from approximately 214 to 216 ns. A read operation 206 follows the precharge phase 204. The secondary sense amplifier enable signal (SSAE), which enables the sense amplifier, goes high ("1") to amplify the differential MDQ-bMDQ data signal. A data out signal (DOUT) rises to indicate that a read "1" operation has been performed successfully.

Figure 6:
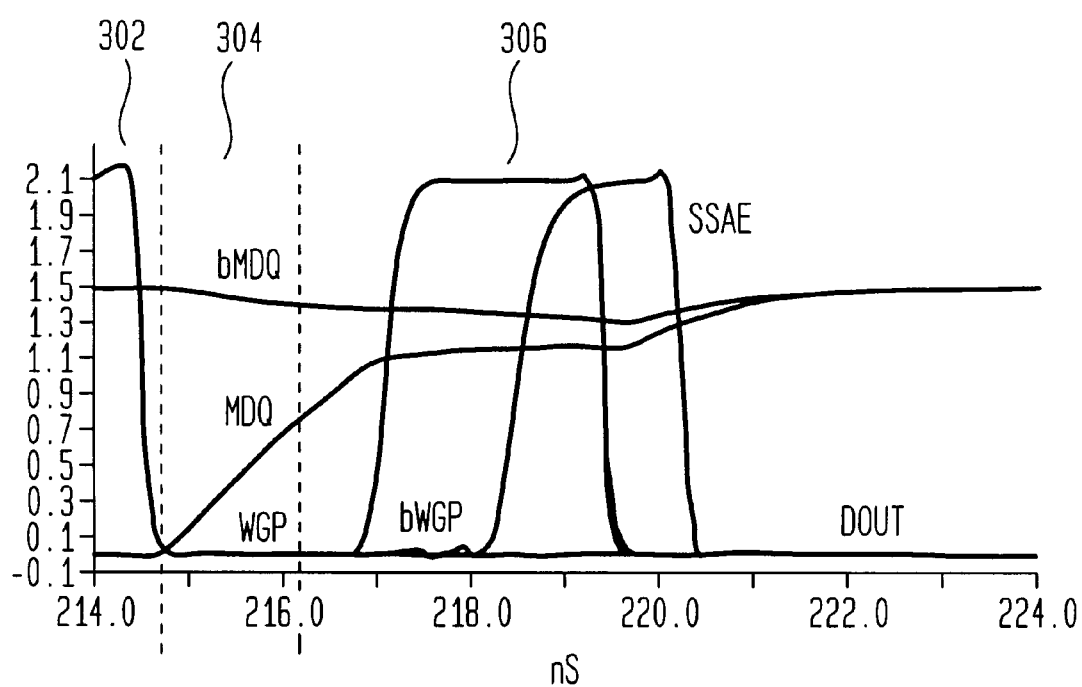
FIG. 6 shows a timing diagram for a conventional driver circuit.

Referring now to FIG. 6, a timing diagram driver circuit without an overdrive subcircuit is shown. As shown in FIG. 6, the driver circuit is unable to perform a read "1" operation 306 after a write "0" operation 302. A precharge operation 304 is performed prior to the read operation 306. It is essential that the MDQ and bMDQ have the same voltage before the read operation starts. If not, than incorrect reading can occur since the differential read voltage is quite small (typically about 200 mV).

The gate voltage signal WGP at the gate of the precharge driver subcircuit for the global databus MDQ and gate voltage bWGP for a corresponding driver for the complement global databus bMDQ are driven low (0 volts). This causes MDQ to rise towards its up-level voltage. However, since the overdrive is less without the overdrive subcircuit to produce the dynamic offset, the global data buses do not equalize prior to the start of the read "1" operation 306. Due to this incomplete equalization of the bMDQ and MDQ buses, incorrect data is read. This is shown by the fact that the data out signal (DOUT) remains at a logic 0, indicating that the data read was a 0 instead of a 1. As a result, such precharge circuit is incapable of operating high frequencies.

In accordance with the present invention, buses may swing between states with increased speeds without requiring higher operating voltages. This is enabled by increasing the overdrive of the driver transistor in the driver subcircuit. This is achieved without dissipating additional power, resulting in reduced power dissipation in comparison with the conventional technique. Depending on the design parameters, a power reduction of about a 33% can be achieved. Due to the increased charge rate and reduction in power dissipation, the present invention provides a driver circuit for use in high frequency semiconductor ICs.

Although the transistors and signals are shown in the figures as a certain type and signal state, the invention shall be construed to incorporate circuits and signals of the opposite type and state. For example, n-FETs may be changed to p-FETs and signals, i.e. logic high may be changed to logic low, to achieve the results in accordance with the present invention described herein.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A driver circuit comprising:
   a driver subcircuit having a p-type driver transistor, wherein the driver transistor comprises first, second, and gate terminals, the first terminal coupled to a first power source, the second terminal coupled to an output of the driver subcircuit, and the gate terminal coupled to an input of the driver subcircuit, the driver circuit activated by an active low driver input signal at the input of the driver subcircuit; and
   an overdrive subcircuit comprising
      a first transistor with first, second, and gate terminals, the gate terminal of the first transistor is coupled to a control input for receiving a control signal, and the second terminal of the first transistor is coupled to the output of the overdrive subcircuit which is coupled to the input of the driver subcircuit and
      a capacitor with first and second terminals, the first terminal of the capacitor is coupled to the gate terminal of the first transistor and the second terminal of the capacitor is coupled to the second terminal of the first transistor, wherein the overdrive circuit, when receiving an active control signal at the control input, generates a negative offset which increases the magnitude of the active low driver signal to increase the performance of the driver subcircuit.

2. The driver circuit according to claim 1 is implemented in a memory IC.

3. The driver circuit according to claim 2 wherein the capacitor comprises a same type of capacitor as a storage capacitor of a memory cell of the memory IC.

4. The driver circuit according to claim 3 wherein the driver output is coupled to a local data-line.

5. The driver circuit according to claim 3 wherein the driver output is coupled to an address line.

6. The driver circuit according to claim 3 wherein the driver output is coupled to a control line.

7. The driver circuit according to claim 3 wherein the driver output is coupled to al global data line.

8. The driver circuit according to claim 2 wherein the driver output is coupled to a local data-line.

9. The driver circuit according to claim 2 wherein the driver output is coupled to an address line.

10. The driver circuit according to claim 2 wherein the driver output is coupled to a control line.

11. The driver circuit according to claim 2 wherein the driver output is coupled to al global data line.

12. The driver circuit according to claim 1 wherein the driver output is coupled to a local data-line.

13. The driver circuit according to claim 1 wherein the driver output is coupled to an address line.

14. The driver circuit according to claim 1 wherein the driver output is coupled to a control line.

15. The driver circuit according to claim 1 wherein the driver output is coupled to al global data line.

16. The driver circuit according to claim 1, 2, 3, 4, 5, 6, 7, 8, 9, 10, 11, 12, 13, 14, or 15 wherein the negative offset comprises a negative dynamic offset.

17. The driver circuit according to claim 16 wherein the negative dynamic offset comprises a peak magnitude of about 0.2 to 1.5 V.

18. The driver circuit according to claim 17 wherein the first transistor of the overdrive subcircuit is an n-type transistor.

19. The driver circuit according to claim 18 wherein the overdrive subcircuit further comprises a second transistor coupled in parallel to the first transistor.

20. The driver circuit according to claim 19 wherein the second transistor is a p-type transistor.

21. The driver circuit according to claim 20 further comprises an inverter, the inverter includes input and output terminals, wherein the input terminal is coupled to the control input of the overdrive subcircuit and the output terminal is coupled to a gate terminal of the second transistor.

22. The driver circuit according to claim 17 wherein the negative dynamic offset causes the active low driver signal to have a peak magnitude of about −0.2 to −1.5 V.

23. The driver circuit according to claim 22 wherein the first transistor of the overdrive subcircuit is an n-type transistor.

24. The driver circuit according to claim 23 wherein the overdrive subcircuit further comprises a second transistor coupled in parallel to the first transistor.

25. The driver circuit according to claim 24 wherein the second transistor is a p-type transistor.

26. The driver circuit according to claim 25 further comprises an inverter, the inverter includes input and output terminals, wherein the input terminal is coupled to the input of the overdrive subcircuit and the output terminal is coupled to a gate terminal of the second transistor.

27. The driver circuit according to claim 26 wherein the negative dynamic offset causes the active low driver signal to have a peak magnitude of about −0.2 to −1.5 V.

28. The driver circuit according to claim 27 wherein the first transistor of the overdrive subcircuit is an n-type transistor.

29. The driver circuit according to claim 28 wherein the overdrive subcircuit further comprises a second transistor coupled in parallel to the first transistor.

30. The driver circuit according to claim 29 wherein the second transistor is a p-type transistor.

31. The driver circuit according to claim 30 further comprises an inverter, the inverter includes input and output terminals, wherein the input terminal is coupled to the input of the overdrive subcircuit and the output terminal is coupled to a gate terminal of the second transistor.

32. The driver circuit according to claim 16 wherein the first transistor of the overdrive subcircuit is an n-type transistor.

33. The driver circuit according to claim 32 wherein the overdrive subcircuit further comprises a second transistor coupled in parallel to the first transistor.

34. The driver circuit according to claim 33 wherein the second transistor is a p-type transistor.

35. The driver circuit according to claim 34 further comprises an inverter, the inverter includes input and output terminals, wherein the input terminal is coupled to the input of the overdrive subcircuit and the output terminal is coupled to a gate terminal of the second transistor.

36. The driver circuit according to claim 16 wherein the overdrive subcircuit further comprises a second transistor coupled in parallel to the first transistor.

* * * * *